United States Patent [19]
Lashley et al.

[11] Patent Number: 6,118,067
[45] Date of Patent: Sep. 12, 2000

[54] METHOD AND APPARATUS FOR IMPROVED SOLAR CONCENTRATION ARRAYS

[75] Inventors: Christopher M. Lashley, Columbia; Stephen J. Krein, Highland; Rosemary Schmidt Thorpe, Clarksville, all of Md.

[73] Assignee: Swales Aerospace, Beltsville, Md.

[21] Appl. No.: 09/196,806

[22] Filed: Nov. 20, 1998

[51] Int. Cl.[7] ................................................ H01L 25/00
[52] U.S. Cl. .......................................... 136/245; 246/292
[58] Field of Search ................................. 136/245, 246, 136/292

[56] References Cited

U.S. PATENT DOCUMENTS

| | | | |
|---|---|---|---|
| 4,988,060 | 1/1991 | Janson | 244/173 |
| 5,131,955 | 7/1992 | Stern et al. | 136/245 |
| 5,154,777 | 10/1992 | Blackmon et al. | 136/246 |
| 5,180,441 | 1/1993 | Cornwall et al. | 136/246 |
| 5,319,905 | 6/1994 | Szirtes | 52/108 |
| 5,344,497 | 9/1994 | Fraas et al. | 136/246 |
| 5,368,654 | 11/1994 | Bergevin et al. | 136/251 |
| 5,383,976 | 1/1995 | Fraas et al. | 136/253 |
| 5,385,615 | 1/1995 | Horne | 136/246 |
| 5,393,018 | 2/1995 | Roth et al. | 244/173 |
| 5,487,791 | 1/1996 | Everman et al. | 136/245 |
| 5,496,414 | 3/1996 | Harvey et al. | 136/245 |
| 5,498,297 | 3/1996 | O'Neill et al. | 136/246 |
| 5,520,747 | 5/1996 | Marks | 136/245 |
| 5,538,563 | 7/1996 | Finkl | 136/246 |
| 5,578,139 | 11/1996 | Jones et al. | 136/245 |
| 5,578,140 | 11/1996 | Yogev et al. | 136/246 |
| 5,660,644 | 8/1997 | Clemens | 136/245 |
| 5,665,174 | 9/1997 | Laing et al. | 136/246 |

OTHER PUBLICATIONS

Backus, "Solar-Energy Conversion at High Solar Intensities" J. Vac. Sci. Technol., vol. 12 No. 5 pp. 1038–1039, Sep. 10, 1975.

*Primary Examiner*—Mark Chapman
*Attorney, Agent, or Firm*—Roberts, Abokhair & Mardula

[57] ABSTRACT

A lightweight photovoltaic concentrator is disclosed. The concentrator comprises at least two sections each comprising a cell panel, a radiator panel and a reflector panel. In one embodiment, the concentrator system of the present invention comprises at least two hinged sections each comprising a solar cell panel, a flat radiator panel, and a curved reflective concentrator panel. The solar cell panel comprises at least one photovoltaic cell for generating electrical power in response to radiation. The solar cell panel is aligned with the radiator panel at an angle less than 180 degrees but not less than 90 degrees facing the reflective concentrator panel. In another embodiment, the cell panels on adjoining sections are angled in opposite directions with respect to the radiator panels and wherein the reflective concentrator panels are located on opposite sides of the radiator panels. A heat pipe or loop heat pipe is located in the radiator panel to dissipate heat from the solar cells.

16 Claims, 2 Drawing Sheets

METHOD AND APPARATUS FOR IMPROVED SOLAR CONCENTRATION ARRAYS

FIELD OF THE INVENTION

The present invention relates generally to an improved method and apparatus for employing photovoltaic concentrator arrays to generate electrical energy from concentrated solar energy.

BACKGROUND

Solar cells which convert radiant energy from the sun into electrical energy are used to power spacecraft. Designers of power systems for this application face numerous design constraints of which weight is one of the most critical. The extraordinarily high cost of placing a pound of weight into space is a serious constraint, and any improvement which can reduce the weight and still provide adequate performance is actively sought.

Another constraint is the need for shielding the solar cells against radiation in regions of high fluence. This significantly increases the weight of the cells. Any arrangement which can reduce the area or volume that must be shielded is also actively sought.

Still another constraint is the high cost of the solar cells. These cells often are as much as 60% or more of the cost of the entire solar array. Reduction of required cell area, while still obtaining the same power output, is another sought-after advantage. Pursuit of this advantage leads to the consideration of Solar Concentrator Arrays. These arrays use optics to concentrate a given cross-sectional area of sunlight into a smaller solar cell area.

Yet another constraint is the volume required to pack a solar cell array into a launch vehicle for containment while being launched. Reduction of stowed envelope volume is another design objective. In most applications, the solar panels or sections are collapsed for storage and launch and require mechanisms to ensure proper deployment. Accordingly, simplicity of folding the array and storage during launch is an objective in this art. Additionally, a less complicated deployment mechanism removes possibilities of errors attributed to more complicated systems.

Accordingly, power generation efforts for spacecraft and other applications are driven by balancing a number of factors which include the following: cost, mass, reliability, complexity, and technical risk. For a concentrator array, key issues are: choice of concentration ratio; reflective versus refractive optics; cell choice and degradation analysis; array pointing accuracy (error tolerance); thermal control and operating temperature; and stowage and deployment approach and sequence.

Electrical power requirements for spacecraft applications are high. Current projections exist for systems up to 25 kW of power. Specific power generation capability, measured in watts of power per kilogram of power generator weight (W/kg), has been limited by the state of the art which, at this time is about 30–42 W/kg. Concentration ratio has been another limiting factor with 1.5:1 being relatively easy to achieve and 8:1 being the present state of the art.

Power generation degradation, i.e., reduced cell efficiency, is yet another constraint. With higher concentration of sun rays, higher temperatures are reached in the cells. Higher temperatures reduce the power conversion efficiency of the cells. Thus, there is a need to efficiently remove heat from the cells when higher concentration ratios are employed.

In the design of solar arrays, more favorable thermal environments are sought. The solar cells run more efficiently at cooler temperatures.

SUMMARY

It is an objective of the present invention to provide a concentrator solar array with a simpler design, lower manufacturing costs, and lighter weight with significantly less performance risk.

It is another object of the invention to provide a more efficient solar array system by reducing the reflective loss.

It is another object of the invention to provide a solar array system with a more favorable thermal environment.

It is a further objective of the present invention to use reflective optics to focus solar energy on the photovoltaic cells.

It is a further objective of the present invention to achieve a decrease in the stowed envelope volume by allowing the panels to nest together.

It is a further objective of the present invention to achieve a simpler mechanical configuration which is less expensive to manufacture with less performance risk.

It is a further objective of the present invention to employ an essentially flat, rather than curved, radiator panel in order to simplify construction and reduce overall cost.

The present invention discloses an improved method and apparatus for employing photovoltaic cells in a solar concentrator primarily for use in generating electrical power for spacecraft applications.

The present invention relates to a photovoltaic concentrator system comprising at least two hinged sections wherein each hinged section comprises a solar cell panel, a radiator panel, and a reflective concentrator panel. The solar cell panel comprises at least one photovoltaic cell for generating electrical power in response to radiation. Additionally, the solar cell panel is aligned with the radiator panel at an angle less than 180 degrees but not less than 90 degrees facing the reflective concentrator panel. The reflective concentrator panel is preferentially curved (parabolic) in shape to both reflect and concentrate radiation to the solar cells.

In another embodiment of the present invention, the cell panels on adjoining sections are angled in opposite directions with respect to the radiator panels. This would also require that the reflective concentrator panels are located on opposite sides of the radiator panels.

In one embodiment, a two phase thermal control system is employed to remove heat from cells to the radiator panels for radiation to space. Also, in one embodiment, heat pipes are employed as the two phase thermal control system. Heat is radiated from both sides of the radiator panels in order to achieve sufficient heat rejection area to give acceptably low cell temperatures. In an additional embodiment, loop heat pipes are employed as the two phase thermal control system. In this additional embodiment, heat is radiated from both sides of the radiator panels in order to achieve sufficient heat rejection area to give acceptably low cell temperatures.

One embodiment of the present invention is directed to photovoltaic concentrators comprising at least one photovoltaic cell for generating electrical power from incident solar radiation. The concentrator has at least one curved reflector. The reflector is directed to the radiation source and both concentrates and reflects the radiation to the photovoltaic cells located in the cell panel. The cell panel is angled toward the folding reflector. The use of a curved reflective concentrator results in a higher concentration ratio as compared to the use of flat reflective concentrators. Concentration ratios are in a range from about 6:1 to about 20:1.

DETAILED DESCRIPTION OF THE INVENTION

Figure 1:
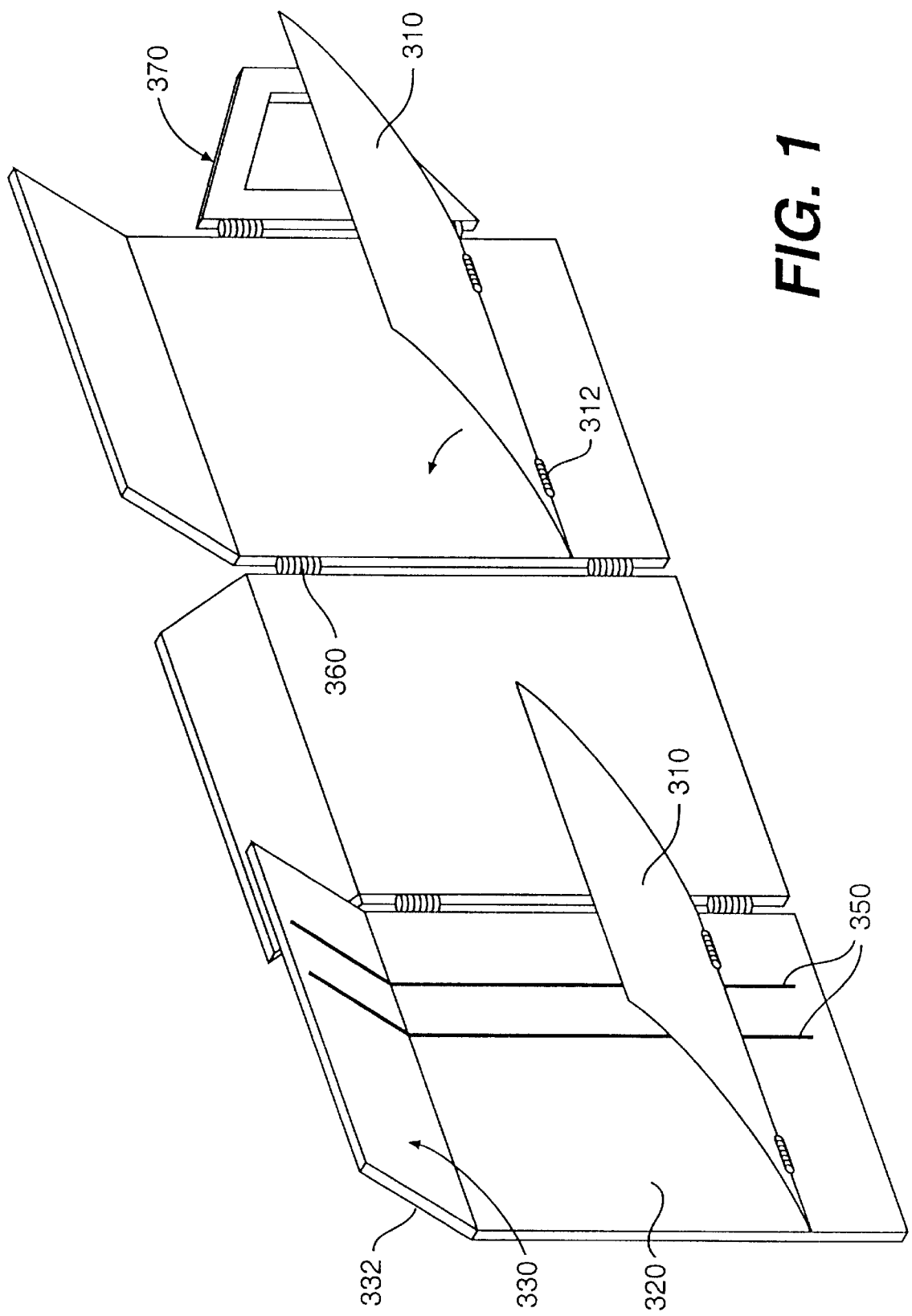
FIG. 1 depicts one embodiment of the invention which employs a deployable curved reflector to concentrate light onto a linear cell array.

One embodiment of the present invention is directed to photovoltaic concentrator systems comprising at least two hinged sections with each section comprising a solar cell panel, a radiator panel, and a reflective concentrator panel. The solar cell panel comprises at least one photovoltaic cell for generating electrical power from radiation. These concentrator systems are applicable for the generation of power to a spacecraft. As such, stowage of the system becomes an issue. Usually, such a system employs two wings with each wing comprising at least two hinged sections. One wing systems are also utilized. Stowage volume and deployment weight are major considerations in the design parameters. Accordingly, the system is designed to be folded in a manner to reduce its stowage volume for transportation to space, thus adding limitations to the design parameters. The target is lighter, simpler and lower cost systems.

Each wing of the solar array comprises at least two sections, with three to four sections being preferable. Each section comprises a solar cell panel that is angled in relationship to the radiation panel. The angle should be less than 180 degrees but not less than 90 degrees. This aligns the solar cells panels in a position facing the reflective concentrator panel. An angle of approximately 45 degrees is preferred. It is also preferred that the solar cells panels are directed in opposite angles on adjacent sections. When three sections and two wings are employed, it is preferred that the solar panels are configured to provide three in each direction while still alternating on adjacent panels. The solar cells or photovoltaic cells are located on the solar cell panel in various configurations. The cells tend to represent the highest cost components in the concentrator system. Various types of photovoltaic cells can be employed. The most preferred cells are the gallium arsenide multi junction (GaAs MJ) cells. These represent the best balance of weight and efficiency in today's commercially available options. Other cells can be used without departure from the invention. Examples of other cells are gallium arsenide single junction cells, gallium tin (GaSn) cells, silicon cells and the like.

Each section of the concentrator has a radiator panel. The radiator panel acts as the primary structure in addition to dissipation of heat from the solar cell panel. For stowage and deployment considerations, it is preferred that the radiator panel is flat. The flat shape simplifies construction and reduces the cost. Further, a flat radiator configuration is easier to test on the ground due to the lack of adverse gravity effects.

The concentrator has at least one reflector. The reflector is directed to the radiation source and both concentrates and reflects the radiation to the cell array located in the cell panel. It is preferred that the reflector is concave and curved in shape. This allows the reflector to concentrate the radiation rather than merely causing the reflection of the radiation. This concentration by the reflector is key to allowing the higher degree of efficiency of the whole system.

In one embodiment, the reflector comprises a single section on the solar cell panel side of the radiator panel and focuses and concentrates radiation to the photovoltaic cells located on the same side of the radiator panel. Each reflector panel can be hinged for folding and stowage while in transport. The methods and material for making the reflector are known in the art. The key is the added function of concentration. As such, the reflector can be made of rigid or flexible material with various methods for achieving the final deployment shape. Further, the concentrator may have means for moving the panels to adjust either the focal point position or angle relative to the photovoltaic cells.

The utilization of curved reflective concentration results in a higher concentration as compared to a flat concentration. The concentration ratios range from about 6:1 to about 20:1. Higher concentration ratios are preferred. The ability of the system to handle higher ratios of concentrations allows the use of fewer photovoltaic cells thus reducing both cost and weight of the system.

Since the system utilizes a separate radiator panel, the reflective panels are not utilized as the means for heat dissipation from the solar cells. Therefore, the choice of reflector surface coating is simplified in that the coating does not have to be both an optical reflection coating and a heat rejection coating. The cost for the dual purpose coatings are significantly higher than reflective coatings, rendering their utilization commercially uncompetitive. As compared to multi-phased reflectors, the utilization of a single phase reflector system leads to a more efficient design in reducing reflective loss of radiation energy.

When higher concentration ratios are utilized, heat dissipation from the photovoltaic solar cells becomes more important. For example, the intensity of concentrated sunlight can significantly raise the temperature of the gallium arsenide solar cell. It is important not to overheat the solar cells because the electrical connections and bonding material used to attach the cells to the structure would be damaged. Further, the cells are more efficient at lower temperatures. Accordingly, a system of the present invention comprises additional means for removing the heat from the photovoltaic cells. The preferred means is a two phase heat removal system such as a heat pipe embedded in the solar cell panel and in the radiator panel.

The two phase heat dissipation system, such as a heat pipe, limits the temperature of the photovoltaic or solar cells by conducting the heat from the solar cells to the radiator panel and rejecting it to space. The heat pipe can also serve as a structural support of the system. Heat pipes are typically hermetically sealed tubes with a wicking device on the inside surface of the tube. A fluid is enclosed in the tube and fills the open center of the heat pipe with its gas phase and the wick with its liquid phase. Heat applied at one end of the pipe will cause evaporation of the liquid in the wick. The gases formed by the evaporation flow down the center of the heat pipe to the opposite end. At this location heat is transferred from the pipe, causing condensation to take place in the wicking material. Capillary forces draw the fluid from the condenser end to the evaporator end of the heat pipe, thus completing a heat transfer loop. These devices exhibit high heat transfer rates with small temperature differences from the evaporator end to the condenser end of the heat pipe. While this is a preferred method, other methods can be employed. For example, a Loop Heat Pipe (LHP) heat removal system can also be employed.

Particular features of this invention include: an array range of 2 kW–25 kW of power output; a concentration ratio range of about 6:1–20:1; an EOL (End-of-Life) Power/Mass Ratio of about 50–70 W/kg; use of reflective optics; a single axis concentration.

FIG. 1 depicts one embodiment of the invention. This embodiment employs a deployable linear curved reflector 310 which concentrates light onto a linear cell array 330 in the center of the cell panel 332. This invention discloses a cell panel angled toward the folding reflector in a fixed position relative to the radiator panel. This fixed position results in a simpler mechanical configuration which is less expensive to manufacture and which has less performance risk than that disclosed by the prior art. However, the cell panel may be hinged or movable.

One configuration is alternating angles of cell panel edges such that the cell panels are facing in alternating and opposite directions. This arrangement of alternating angles of cell panel edges facilitates the folding of the panels during predeployment and reduces stowed envelope volume as compared to that disclosed by the prior art by allowing the panels to nest together. Additionally, this configuration results in a larger radiation surface when compared to the active solar cells.

The radiator panel is preferably flat, rather than curved, resulting in simplified construction and reduced overall cost.

An active two phase thermal control system is utilized to move heat from cells to the radiator panel for radiation to space. Heat pipes 350 are utilized. In this embodiment, heat is radiated from both sides of the radiator panel 320 allowing sufficient heat rejection area thus reducing cell temperatures and minimizing cell damage attributed to high temperatures. Concentration ratios in this embodiment are up to about 20:1 and preferably from about 6:1 to 20:1.

During the preliminary deployment sequence, the reflector 310 is deformed elastically to a flat configuration and against the radiator panel. Each reflector 310 also includes a deployment means, an example of which includes, but is not limited to, an actuator or a spring which tends to move the reflector to its fully deployed position. The two sections, middle and outermost from the yoke 370 attaching the invention to the host, are rotated about the panel hinges 360 such that the outermost is parallel to and adjacent to the middle section, which in turn, is parallel to and adjacent to the section which is innermost and adjacent to the yoke 370. The cells 330 of the innermost, middle, and outermost sections 310 are facing in the same direction with all the cells 330 of the outermost section facing inward. Each panel hinge 360 also includes a deployment means, an example of which includes, but is not limited to, an actuator or a spring which tends to move the array to the fully extended position. A plurality of retaining bolts is employed to maintain the invention in its folded configuration.

During the deployment sequence, explosive charges are used to shear the retaining bolts holding the invention in its folded configuration thereby allowing the deployment means, an example of which includes, but is not limited to, an actuator or a spring located in the panel hinges 360 to return the invention to its original, fully extended configuration. Other conventional techniques may be used to stow and deploy the solar concentrator. Additionally, the reflector 310 is unfolded, rotating about the reflector hinges 312 to assume a fully deployed position, and resuming its curved shape, with the middle and outermost sections being rotated about the panel hinges 360 and allowed to return to their original fully extended position. The use of actuators and the use of spring loading are common practices in unmanned satellites and are well known in the art.

During operation, available light is reflected from the surface of the reflector 310 onto at least one linear array of photovoltaic cells 330 located in the cell panel 332. Waste heat flows from the cells 330 through heat pipes 350 which conform to the angled surface of the cell panel 332 and which are embedded in or attached to the radiator panel 320 for radiation to space from both sides of the radiator panel 320. A concentration ratio in the range of 6:1–20:1 is achieved by this embodiment. Such a concentration ratio necessitates the use of a two phase thermal control system with heat pipes 350 being used. An additional embodiment employs a two phase thermal control system with loop heat pipes being used.

Figure 2:
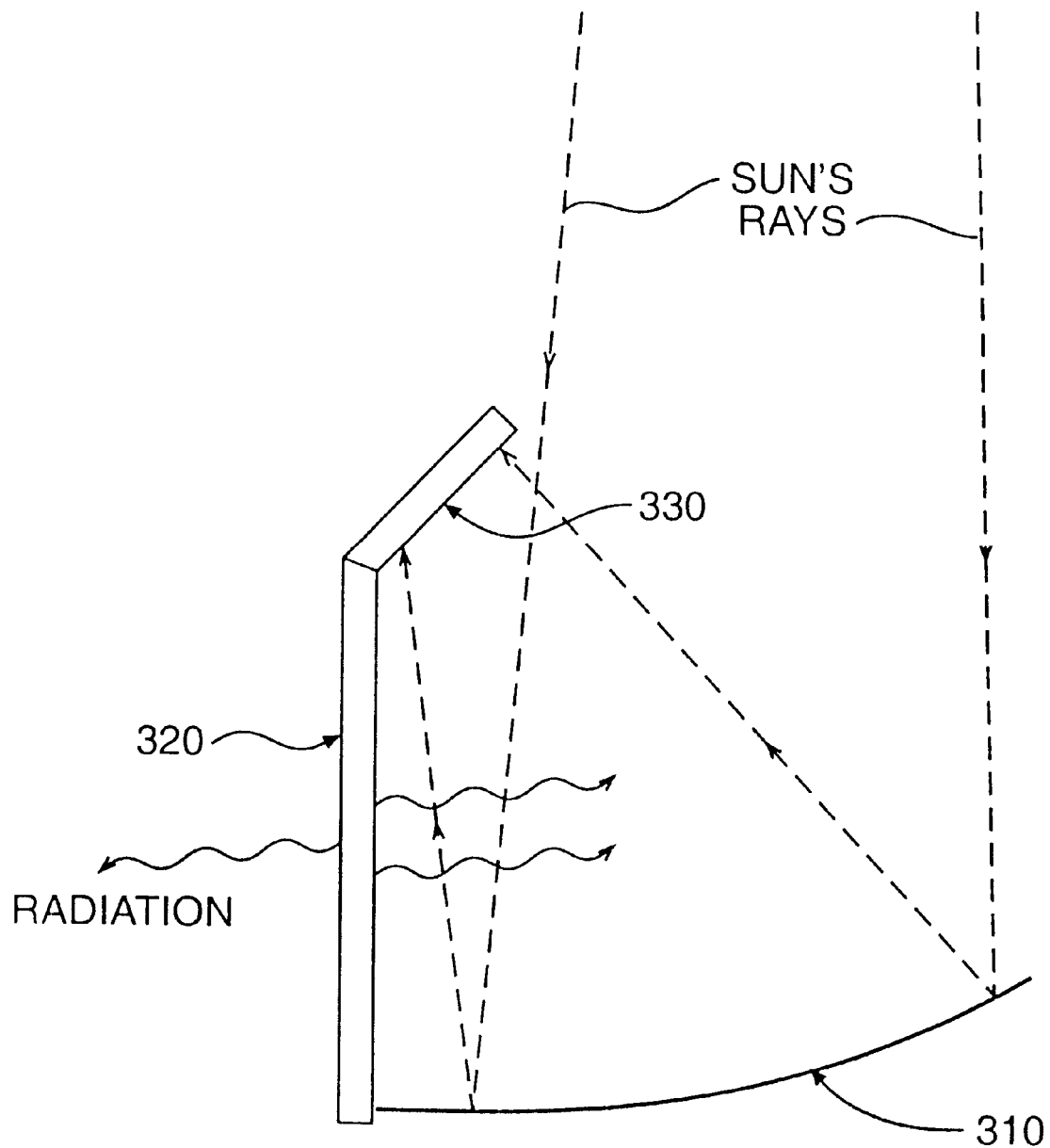
FIG. 2 is a side view of one section in an embodiment of the present invention.

FIG. 2 shows a side view of one section of an embodiment of the present invention. A concave reflector panel 310 is utilized. The sun's rays are reflected off of the reflector panel 310. The rays are also concentrated by the reflector panel 310 and directed to the solar cell panel 330. Heat generated by the solar cell panel 330 is dissipated to the radiator panel 320 and radiated to space from both sides of the radiator panel.

Although the present invention has been described in considerable detail with reference to certain preferred versions thereof, other versions are possible. For example, two angled cell panels and two reflector panels can be employed in each section. Therefore, the spirit and scope of the appended claims should not be limited to the description of the preferred versions contained herein.

What is claimed is:

1. A photovoltaic concentrator system comprising:
   at least two hinged sections each comprising a solar cell panel, a radiator panel, and a reflective concentrator panel; wherein
   the solar cell panel comprises at least one photovoltaic cell for generating electrical power in response to radiation;
   the solar cell panel is aligned with the radiator panel at an angle less than 180 degrees but not less than 90 degrees facing the reflective concentrator panel; and
   the reflective concentrator panel is shaped to reflect and concentrate radiation to the solar cells.

2. The concentrator system of claim 1 wherein the photovoltaic cells are gallium arsenide multi junction cells.

3. The concentrator system of claim 1 wherein the reflective concentrator panel is concave in shape.

4. The concentrator system of claim 1 wherein the photo voltaic cells are located in at least one linear row in the center of the solar cell panel and wherein the solar cell panel is at about 45 degrees in relation to the radiator panel.

5. The concentrator system of claim 1 wherein the final concentration ratio is greater than 8:1.

6. The concentrator system of claim 1 further comprising a two phase heat removal system to remove heat generated in the photovoltaic cells wherein the heat is directed from the cell panel to the radiator panel.

7. The concentrator system of claim 6 wherein the two phase heat removal system is a heat pipe.

8. The concentrator system of claim 6 wherein the heat removal system is a loop heat pipe.

9. The concentrator system of claim 1 wherein the cell panels on adjoining sections are angled in opposite directions with respect to the radiator panels and wherein the reflective concentrator panels are located on opposite sides of the radiator panels.

10. The concentrator system of claim 1 wherein the radiator panel is flat.

11. A photovoltaic concentrator system comprising:

at least two hinged sections each comprising a solar cell panel, a flat radiator panel, and a curved reflective concentrator panel; wherein the solar cell panel comprises at least one photovoltaic cell for generating electrical power in response to radiation;

the solar cell panel is aligned with the radiator panel at an angle less than 180 degrees but not less than 90 degrees facing the reflective concentrator panel; and the cell panels on adjoining sections are angled in opposite directions with respect to the radiator panels and wherein the reflective concentrator panels are located on opposite sides of the radiator panels.

12. A photovoltaic concentrator system comprising:

at least two hinged sections each comprising a solar cell panel, a radiator panel, and a reflective concentrator panel; wherein the solar cell panel comprises at least one photovoltaic cell for generating electrical power in response to radiation;

the solar cell panel is aligned with the radiator panel at an angle less than 180 degrees but not less than 90 degrees facing the reflective concentrator panel;

the cell panels on adjoining sections are angled in opposite directions with respect to the radiator panels and wherein the reflective concentrator panels are located on opposite sides of the radiator panels; and the radiator panel comprises a heat pipe.

13. The concentrator system of claim 12 wherein the photovoltaic cells comprise gallium arsenide multi junction cells.

14. The solar concentrator system of claim 12 comprising two wings each having three to four hinged sections.

15. The solar concentrator system of claim 12 wherein the radiator panel is flat.

16. The solar concentrator system of claim 12 wherein the reflective concentrator panel is parabolic.

* * * * *